(12) United States Patent
Wang et al.

(10) Patent No.: US 10,497,728 B2
(45) Date of Patent: Dec. 3, 2019

(54) FINGERPRINT SENSING CHIP PACKAGING METHOD AND FINGERPRINT SENSING CHIP PACKAGE

(71) Applicant: China Wafer Level CSP Co., Ltd., Suzhou, Jiangsu (CN)

(72) Inventors: Zhiqi Wang, Suzhou (CN); Yuanfei Liu, Suzhou (CN); Hongjun Liu, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 15/815,460

(22) Filed: Nov. 16, 2017

(65) Prior Publication Data

US 2018/0145102 A1 May 24, 2018

(30) Foreign Application Priority Data

Nov. 22, 2016 (CN) .......................... 2016 1 1040862

(51) Int. Cl.
*H01L 27/146* (2006.01)
*H01L 23/00* (2006.01)
(Continued)

(52) U.S. Cl.
CPC ...... *H01L 27/14618* (2013.01); *G06K 9/0002* (2013.01); *G06K 9/00053* (2013.01);
(Continued)

(58) Field of Classification Search
CPC ........... H01L 27/14618; H01L 23/4985; H01L 24/48; H01L 27/14623; H01L 27/14636;
(Continued)

(56) References Cited

U.S. PATENT DOCUMENTS 8,717,775 B1 5/2014 Bolognia et al.
2016/0049526 A1* 2/2016 Oganesian ........ H01L 31/02002
257/434

(Continued)

FOREIGN PATENT DOCUMENTS

CN 104681454 A 6/2015
CN 206349333 U 7/2017

OTHER PUBLICATIONS

First Office Action for Chinese Application No. 201611040862.2, dated Oct. 26, 2018.

*Primary Examiner* — Fernando L Toledo
*Assistant Examiner* — Neil R Prasad
(74) *Attorney, Agent, or Firm* — Wolf, Greenfield & Sacks, P.C.

(57) ABSTRACT

A fingerprint sensing chip packaging method and package are provided. The method includes: providing a cover plate, providing a fingerprint sensing chip, where a fingerprint sensing region and contact pads at periphery of the region are arranged on a front surface of the chip, electrically connecting the contact pads to a back surface of the chip, forming a first conductive structure electrically connected to the contact pads on the back surface of the chip, laminating the front surface of the chip with a back surface of the cover plate, providing a flexible printed circuit, where a second conductive structure is arranged on a back surface of the circuit and an opening is arranged in the circuit, laminating a front surface of the circuit with the back surface of the cover plate, and electrically connecting the first conductive structure to the second conductive structure.

18 Claims, 8 Drawing Sheets

(51) Int. Cl.
  *G06K 9/00* (2006.01)
  *H01L 23/498* (2006.01)
(52) U.S. Cl.
  CPC ........ *H01L 24/48* (2013.01); *H01L 27/14623* (2013.01); *H01L 27/14636* (2013.01); *H01L 27/14678* (2013.01); *H01L 27/14685* (2013.01); *H01L 27/14687* (2013.01); *G06K 9/00013* (2013.01); *H01L 23/4985* (2013.01); *H01L 2224/18* (2013.01); *H01L 2224/4824* (2013.01); *H01L 2224/48091* (2013.01); *H01L 2224/48155* (2013.01)
(58) Field of Classification Search
  CPC ......... H01L 27/14678; H01L 27/14685; H01L 27/14687; H01L 2224/48155; G06K 9/00013
  See application file for complete search history.

(56) References Cited

U.S. PATENT DOCUMENTS

| | | |
|---|---|---|
| 2016/0141235 A1 | 5/2016 | Lin et al. |
| 2016/0190353 A1* | 6/2016 | Liao .................. H01L 27/14618 257/432 |
| 2017/0061193 A1* | 3/2017 | Young ................ G06K 9/00013 |
| 2017/0287797 A1* | 10/2017 | Wang ..................... H01L 23/32 |

* cited by examiner

FINGERPRINT SENSING CHIP PACKAGING METHOD AND FINGERPRINT SENSING CHIP PACKAGE

CROSS REFERENCE TO RELATED APPLICATION

This application claims the priority to Chinese Patent Application No. 201611040862.2, titled "FINGERPRINT SENSING CHIP PACKAGING METHOD AND FINGERPRINT SENSING CHIP PACKAGE", filed on Nov. 22, 2016 with the State Intellectual Property Office of the PRC, which is incorporated herein by reference in its entirety.

FIELD

The present disclosure relates to the technical field of semiconductor package, and particularly to fingerprint sensing chip packaging technology.

BACKGROUND

With the progress of modern society, people pay more and more attention to personal identity recognition and personal information security. Due to the uniqueness and invariance of human fingerprints, fingerprint recognition technology has the features of good security, high reliability and being simple and easy to use, and thus is widely applied in various fields for protecting personal information security. With the continuous development of science and technology, information security of various types of electronic products is always one of the key concerns of the technology development. Especially mobile terminals such as cell phones, laptops, tablet computers and digital cameras have a high requirement for information security, and accordingly have an increasing requirement for the fingerprint sensing technology.

Because of the continuous development towards miniaturization and multi-functionality of the electronic products, a fingerprint recognition device should be packaged under requirements of a small size and high fingerprint recognition sensitivity. How to reduce the packaging size of a fingerprint sensing chip and optimize the fingerprint sensing chip package has become a research focus in this field.

SUMMARY

The present disclosure aims to provide a fingerprint sensing chip packaging method and a fingerprint sensing chip package, to optimize the fingerprint sensing chip package and reduce the packaging size of the fingerprint sensing chip, thereby meeting a high integration level requirement and a high stability requirement of electronic products, and improving the stability of the fingerprint sensing chip package.

A fingerprint sensing chip packaging method is provided according to the present disclosure, which includes: providing a cover plate; providing a fingerprint sensing chip, where a fingerprint sensing region and contact pads arranged at periphery of the fingerprint sensing region are arranged on a front surface of the fingerprint sensing chip, electrically connecting the contact pads to a back surface of the fingerprint sensing chip, and forming a first conductive structure electrically connected to the contact pads on the back surface of the fingerprint sensing chip; laminating the front surface of the fingerprint sensing chip with a back surface of the cover plate; providing a flexible printed circuit, where a second conductive structure is arranged on a back surface of the flexible printed circuit, and an opening is arranged in the flexible printed circuit; laminating a front surface of the flexible printed circuit with the back surface of the cover plate, where the fingerprint sensing chip is arranged in the opening; and electrically connecting the first conductive structure to the second conductive structure.

Preferably, the cover plate may be a transparent substrate, and a shading ink layer may be formed on the back surface of the cover plate before the fingerprint sensing chip is laminated with the cover plate.

Preferably, a DAF film may be adhered to the back surface of the cover plate, to laminate and fix the fingerprint sensing chip with the cover plate.

Preferably, the back surface of the cover plate may be coated with an adhesive, to laminate and fix the fingerprint sensing chip with the cover plate, and a dielectric constant of the adhesive may be greater than or equal to 4.

Preferably, the electrically connecting the contact pads to the back surface of the fingerprint sensing chip and forming the first conductive structure may include: providing a wafer, where the wafer includes multiple fingerprint sensing chips arranged in a grid, the fingerprint sensing region and the contact pads are arranged on a front surface of the wafer; forming grooves at positions on a back surface of the wafer corresponding to the contact pads, where the depth of each of the grooves is less than the thickness of the wafer; forming through holes in the grooves, where the through holes have a one-to-one correspondence with the contact pads, and the contact pads are exposed through the through holes; forming an insulation layer which covers the back surface of the wafer, the grooves and the through holes, where the contact pads are exposed through the insulation layer; forming a redistribution layer, where the redistribution layer extends onto the back surface of the wafer and is electrically connected to the contact pads; forming a protective layer which covers the redistribution layer; forming a hole on the protective layer, where the hole is arranged on the back surface of the wafer, and the redistribution layer is exposed through the hole.

Preferably, a metal wire may be provided, and one end of the metal wire may be electrically connected to the redistribution layer exposed through the hole and the other end of the metal wire may be electrically connected to the second conductive structure by a wire bonding process.

Preferably, a plastic packaging layer which clads at least the metal wire may be formed after the first conductive structure is electrically connected to the second conductive structure.

Preferably, after the first conductive structure is electrically connected to the second conductive structure, a front frame may be provided on a front surface of the cover plate, the front frame may be provided with a window, a region of the cover plate corresponding to the fingerprint sensing region may be exposed through the window, a rear cover may be provided on the back surface of the flexible printed circuit, and the rear cover may be clamped and fixed with the front frame.

Preferably, a plastic packaging material may be filled in an accommodating cavity formed by surrounding by the front frame and the rear cover through an injection molding process.

A fingerprint sensing chip package is further provided according to the present disclosure, which includes: a cover plate; a fingerprint sensing chip, where a fingerprint sensing region and contact pads arranged at periphery of the fingerprint sensing region are arranged on a front surface of the fingerprint sensing chip, the contact pads are electrically connected to a back surface of the fingerprint sensing chip, a first conductive structure electrically connected to the contact pads is formed on the back surface of the fingerprint sensing chip, and the front surface of the fingerprint sensing chip is laminated with a back surface of the cover plate; and a flexible printed circuit, where a second conductive structure is arranged on a back surface of the flexible printed circuit, an opening is arranged in the flexible printed circuit, a front surface of the flexible printed circuit is laminated with the back surface of the cover plate, the fingerprint sensing chip is arranged in the opening, and the first conductive structure is electrically connected to the second conductive structure.

Preferably, the cover plate may be a transparent substrate, and the back surface of the cover plate may be coated with shading ink.

Preferably, the fingerprint sensing chip package may further include a DAF film, and two surfaces of the DAF film may be adhered to the cover plate and the fingerprint sensing chip respectively.

Preferably, the back surface of the cover plate may be coated with an adhesive, to laminate and fix the fingerprint sensing chip with the cover plate, and a dielectric constant of the adhesive may be greater than or equal to 4.

Preferably, the first conductive structure may include: grooves formed on the back surface of the fingerprint sensing chip, where positions of the grooves correspond to positions of the contact pads, and the depth of each of the grooves is less than the thickness of the fingerprint sensing chip; through holes formed in the grooves, where the through holes have a one-to-one correspondence with the contact pads, and the contact pads are exposed through the though holes; an insulation layer which covers the back surface of the fingerprint sensing chip, the grooves and the through holes, where the contact pads are exposed through the insulation layer; a redistribution layer arranged on the insulation layer, where the redistribution layer extends onto the back surface of the fingerprint sensing chip and is electrically connected to the contact pads; a protective layer which covers the redistribution layer; and a hole formed on the protective layer, where the hole is arranged on the back surface of the fingerprint sensing chip, and the redistribution layer is exposed through the hole.

Preferably, the fingerprint sensing chip package may further include a metal wire, where one end of the metal wire is electrically connected to the redistribution layer exposed through the hole, and the other end of the metal wire is electrically connected to the second conductive structure.

Preferably, the fingerprint sensing chip package may further include a plastic packaging layer which clads at least the metal wire.

Preferably, a front frame may be provided on a front surface of the cover plate, the front frame may be provided with a window, a region of the cover plate corresponding to the fingerprint sensing region may be exposed through the window, a rear cover may be provided on the back surface of the flexible printed circuit, and the rear cover is clamped and fixed with the front frame.

Preferably, a plastic packaging material may be filled in an accommodating cavity formed by surrounding by the front frame and the rear cover.

The beneficial effect of the present disclosure is to decrease the packaging size of the fingerprint sensing chip by optimizing the fingerprint sensing chip packaging method and the fingerprint sensing chip package, thereby meeting a high integration level requirement and a high stability requirement of electronic products and improving the stability of the fingerprint sensing chip package.

DETAILED DESCRIPTION OF EMBODIMENTS

Figure 1:
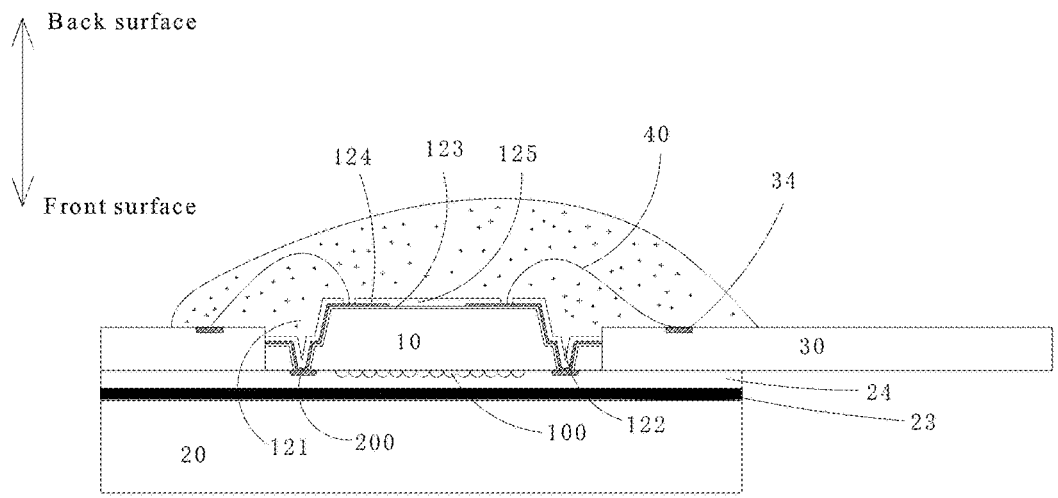
FIG. 1 is a schematic diagram of a fingerprint sensing chip package according to a preferred embodiment of the present disclosure.

The embodiments of the present disclosure are described in detail hereinafter in conjunction with the drawings. The embodiments are not intended to limit the present disclosure, various changes made onto structures, methods or functions by those skilled in the art according to the embodiments all fall within the protection scope of the present disclosure.

It should be noted that the drawings are provided to help understanding the embodiments of the present disclosure, and should not be interpreted as an improper restriction on the present disclosure. For clarity, the size shown in the drawings is not drawn to scale and may be magnified, reduced or altered in other way. In addition, the size of the three-dimensional space of length, width and depth should be included in the actual manufacture. Furthermore, a structure in which the first feature is arranged on the second feature described below may include an embodiment in which the first feature is in direct contact with the second feature, and may also include an embodiment in which there is another feature formed between the first feature and the second feature, in this case, the first feature may not be in direct contact with the second feature.

Reference is made to FIG. 1, which is a schematic structural diagram of a fingerprint sensing chip package according to a preferred embodiment of the present disclosure. The fingerprint sensing chip package includes a fingerprint sensing chip 10, a cover plate 20 and a flexible printed circuit 30.

A fingerprint sensing region 100 and contact pads 200 arranged at periphery of the fingerprint sensing region 100 are arranged on a front surface of the fingerprint sensing chip 10. The contact pads 200 are electrically connected to the fingerprint sensing region 100 to form an electrical signal transmission path. The contact pads 200 are electrically connected to a back surface of the fingerprint sensing chip 10, and a first conductive structure electrically connected to the contact pads 200 is arranged on the back surface of the fingerprint sensing chip 10.

In the embodiment, the first conductive structure includes: grooves 121 formed on the back surface of the fingerprint sensing chip 10, where positions of the grooves 121 correspond to positions of the contact pads 200, the depth of each of the grooves 121 is less than the thickness of the fingerprint sensing chip 10; through holes 122 formed in the grooves 121, where the through holes 122 have a one-to-one correspondence with the contact pads 200, and the contact pads 200 are exposed through the though holes 122; an insulation layer 123 which covers the back surface of the fingerprint sensing chip 10, inner walls of the grooves 121 and the through holes 122, the contact pads 200 are exposed through the insulation layer 123; a redistribution layer 124 arranged in the grooves 121 and the through holes 122 and extending onto the back surface of the fingerprint sensing chip 10, where the redistribution layer 124 is electrically connected to the contact pads 200; a protective layer 125 which covers the redistribution layer 124; and a hole formed in the protective layer 125, where the hole is arranged on the back surface of the fingerprint sensing chip 10, and the redistribution layer 124 is exposed at the bottom of the hole.

The front surface of the fingerprint sensing chip 10 is laminated with a back surface of the cover plate 20. The cover plate 20 is made of a material having a high dielectric constant, such as glass or ceramic. In the embodiment, the cover plate 20 is a transparent substrate, and the back surface of the cover plate 20 is coated with shading ink 23.

The fingerprint sensing chip 10 is laminated and fixed with the cover plate 20 through a DAF film or an adhesive. In the embodiment, a DAF film 24 is arranged on the back surface of the cover plate 20, and the front surface of the fingerprint sensing chip 10 is laminated with the DAF film 24, thereby ensuring flatness of laminating and fixing the fingerprint sensing chip 10. If the adhesive is adopted, in order to avoid decreasing the sensitivity of the fingerprint sensing, the adhesive is made of a material having a high dielectric constant. The dielectric constant of the adhesive is greater than or equal to 4.

An opening is arranged on the flexible printed circuit 30, and a front surface of the flexible printed circuit 30 is laminated with the back surface of the cover plate 20. The fingerprint sensing chip 10 is arranged in the opening, thereby decreasing the thickness of the fingerprint sensing chip package. A second conductive structure is arranged on a back surface of the flexible printed circuit 30. In the embodiment, the second conductive structure is a metal pad 34 exposed from the flexible printed circuit 30. The metal pad 34 is electrically connected to the first conductive structure of the fingerprint sensing chip 10 through a metal wire 40. One end of the metal wire 40 is electrically connected to the redistribution layer 124 exposed at the bottom of the hole 126, and the other end of the metal wire 40 is electrically connected to the metal pad 34 on the flexible printed circuit 30. A plastic packaging layer 50 is arranged to completely clad at least the metal wire 40, thereby fixing, insulating and protecting the metal wire 40.

Figure 2:
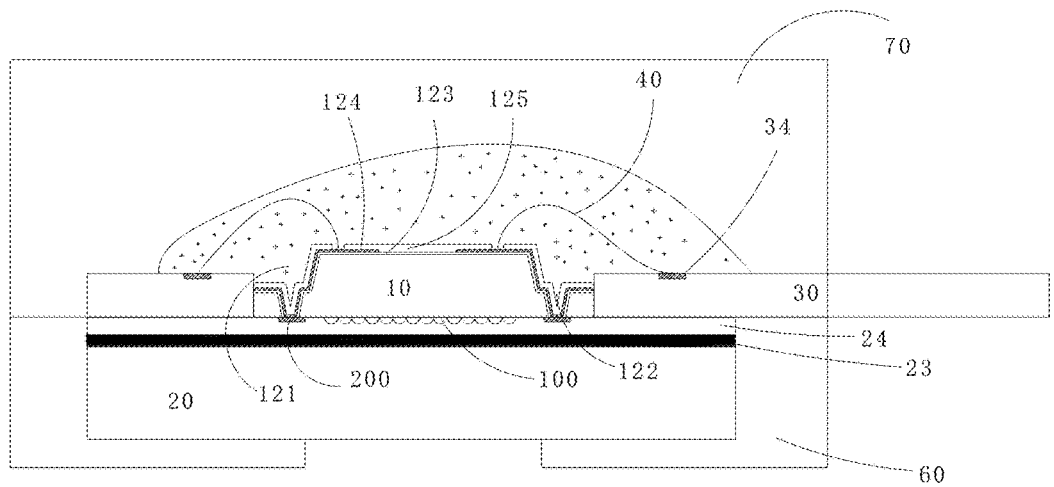
FIG. 2 is a schematic diagram of a fingerprint sensing chip package according to another embodiment of the present disclosure.

Referring to FIG. 2, furthermore, the fingerprint sensing chip package further includes a front frame 60 and a rear cover 70 clamped and fixed with the front frame 60. The front frame 60 is arranged on a front surface 21 of the cover plate 20, and the front frame 60 is provided with a window 61. A partial region of the fingerprint cover plate 20 is exposed through the window 61, and the partial region corresponds to the finger sensing region 100, thereby facilitating fingerprint information acquisition of the fingerprint sensing chip 10. The rear cover 70 is arranged on the back surface of the flexible printed circuit 30. An accommodating cavity is formed by surrounding by the front frame 60 and the rear cover 70, and in order to further improve the stability of the fingerprint sensing chip package, a plastic packaging material is filled in all gaps in the accommodating cavity. A part of the flexible printed circuit 30 is exposed outside the accommodating cavity, thereby facilitating electrically connecting the flexible printed circuit 30 to an external circuit.

Accordingly, a fingerprint sensing chip packaging method is provided in the present disclosure.

Figure 3A:
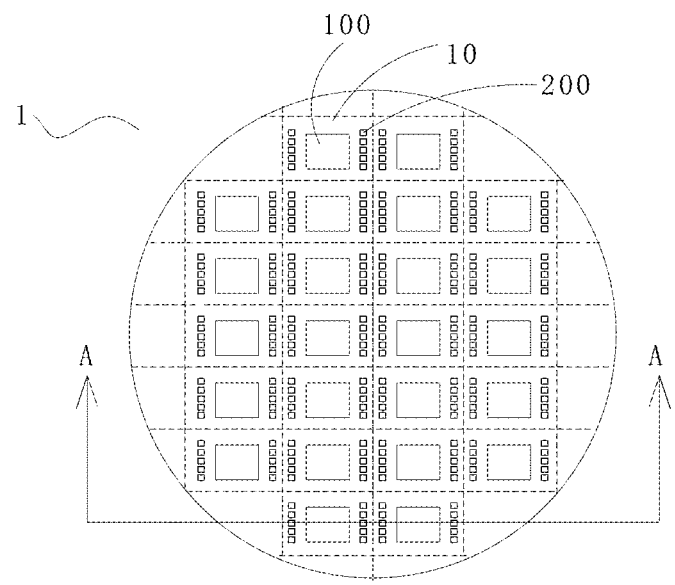
FIG. 3(a) is a schematic plan view of a wafer according to a preferred embodiment of the present disclosure.
Figure 3B:
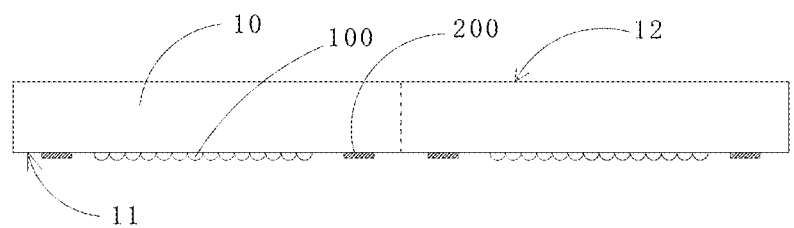
FIG. 3(b) is a schematic sectional view of FIG. 3(a) along A-A.

Referring to FIG. 3(a) and FIG. 3(b), a wafer 1 is provided, FIG. 3(a) is a schematic plan view of the wafer 1, and FIG. 3 (b) is a schematic sectional view of the wafer 1. The wafer 1 includes multiple fingerprint sensing chips 10 arranged in a grid, each of the fingerprint sensing chips 10 has a fingerprint sensing region 100 and contact pads 200 arranged at periphery of the fingerprint sensing region 100. In the embodiment, in each fingerprint sensing chip 10, multiple contact pads 200 are arranged in two columns at two opposite sides of the fingerprint sensing region 100. The wafer 1 has a front surface 11 and a back surface 12 opposite to each other, and the fingerprint sensing region 100 and the contact pads 200 are arranged on the front surface 11 of the wafer 1.

Figure 4:
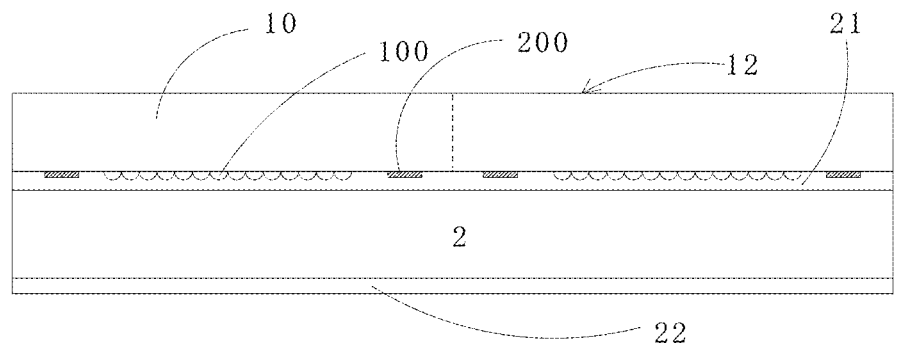
FIG. 4 is a schematic structural diagram obtained after a protective substrate is aligned and laminated with a wafer according to a preferred embodiment of the present disclosure.

Referring to FIG. 4, a protective substrate 2 is provided, and the protective substrate 2 is aligned and laminated with the wafer 1. A shape and a size of the protective substrate 2 are the same as those of the wafer 1, and the thickness of protective substrate 2 may be different from that of the wafer 1. A temporary bonding adhesive layer 21 is formed on one surface of the protective substrate 2 or the front surface of the wafer 1, and then the wafer 1 is aligned and laminated with the protective substrate 2.

In the embodiment, the protective substrate 2 is a transparent substrate, and the temporary bonding adhesive layer 21 is made of a UV glue with UV light sensitive properties. When the UV light irradiates onto the temporary bonding adhesive layer 21 through the protective substrate 2, the temporary bonding adhesive layer 21 may lose stickiness.

In order to prevent the protective substrate 2 from being worn during a packaging process, a protective tape 22 is arranged on the other surface of the protective substrate 2.

Figure 5A:
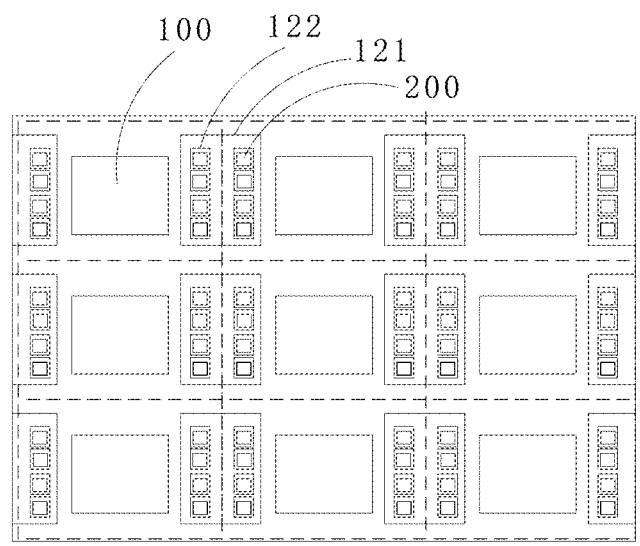
FIG. 5(a) is a schematic plan view obtained after grooves and through holes are formed according to a preferred embodiment of the present disclosure.
Figure 5:
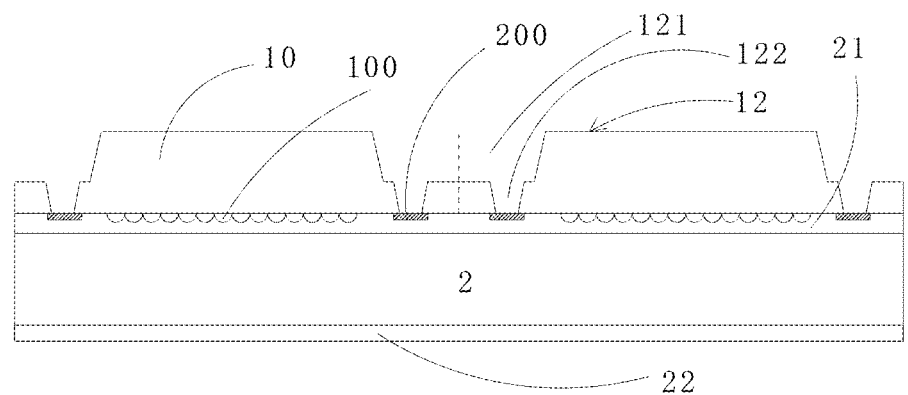
FIG. 5(b) is a schematic sectional view obtained after grooves and through holes are formed according to a preferred embodiment of the present disclosure.

Reference is made to FIG. 5(a) and FIG. 5(b), which are a schematic plan view and a schematic sectional view respectively. Multiple separate grooves 121 are formed on a second surface 12 of the wafer 1, positions of the grooves 121 correspond to the positions of the contact pads 200, and the depth of the groove 121 is less than the thickness of the wafer 1. Through holes 122 are formed in the grooves 121, the through holes 122 have a one-to-one correspondence with the contact pads 200, and the contact pads 200 are exposed through the through holes 122.

In order to avoid reducing packaging yield of the wafer 1 since the intensity of the wafer 1 is too low in a case that the grooves 121 are arranged during the packaging process, the size of the groove 121 is controlled in the present disclosure, the length of the groove 121 is set to be less than the length of a side of the fingerprint sensing chip 10 where the groove 121 is arranged in the present disclosure. In this way, an enough space is formed between adjacent fingerprint sensing chips 10 in the wafer 1, thereby ensuring the intensity of connection between the adjacent fingerprint sensing chips 10, avoiding a risk of cracking of the wafer 1 during the package process and improving the packaging yield.

In the embodiment, the grooves 121 are formed by an etching process. Each of the grooves 121 spans across two fingerprint sensing chips 10, that is, the groove 121 has two columns of contact pads 200, and the two columns of contact pads 200 belong to two adjacent fingerprint sensing chips 10, respectively. After the packaging process is completed subsequently, the wafer 1 is cut along a center line of the groove 121.

After the wafer 1 is cut, the adjacent fingerprint sensing chips 10 are separated. It is important for a single fingerprint sensing chip 10 to ensure the strength of corners of the fingerprint sensing chip. In the embodiment, the fingerprint sensing chip 10 has a first side and a second side opposite to each other, two ends of a side where the groove is arranged are connected to the first side and the second side respectively, and two ends of the groove are not connected to the first side and the second side.

Figure 6:
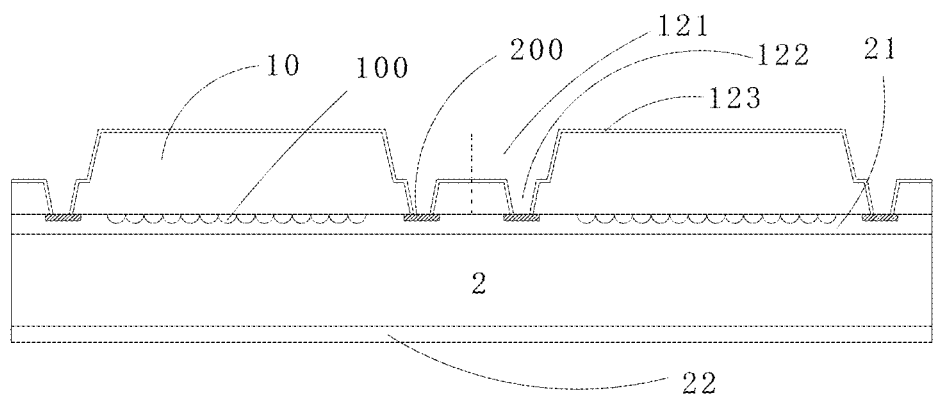
FIG. 6 is a schematic structural diagram obtained after an insulation layer is formed according to a preferred embodiment of the present disclosure.

Referring to FIG. 6, an insulation layer 123 is formed on the second surface 12 of the wafer 1, the insulation layer 123 covers the second surface 12 of the wafer 1, the grooves 121 and the through holes 122. The contact pads are exposed through the insulation layer 123.

The insulation layer 123 is made of silicon oxide, silicon nitride, silicon oxynitride or a resin dielectric material.

Figure 7:
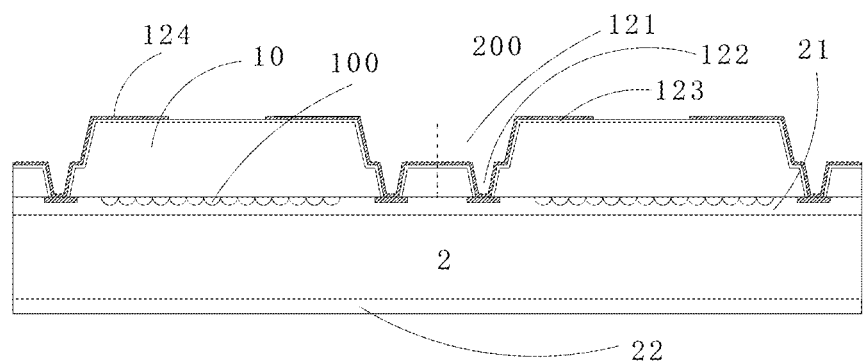
FIG. 7 is a schematic structural diagram obtained after a redistribution layer is formed according to a preferred embodiment of the present disclosure.

Referring to FIG. 7, a redistribution layer 124 is formed. The redistribution layer 124 is electrically connected to the contact pads 200, and the redistribution layer 124 is arranged in the grooves 121 and the through holes 122 and extends onto the second surface 12 of the wafer 1.

The redistribution layer 124 is distributed selectively on the surface of the insulation layer 123 and is electrically connected to the contact pads 200 by a mature RDL process. The redistribution layer 124 is not continuous and is connected to different contact pads 200 which are insulated from each other.

Figure 8:
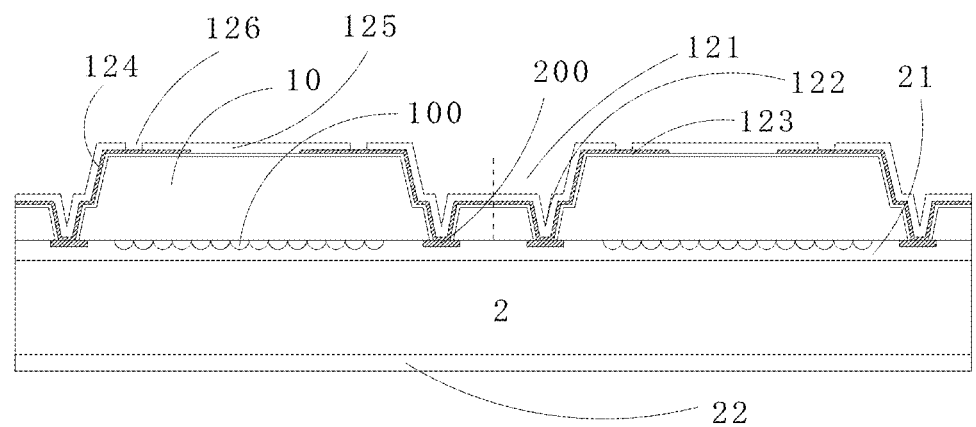
FIG. 8 is a schematic structural diagram obtained after a solder mask and openings in the solder mask are formed according to a preferred embodiment of the present disclosure.

Referring to FIG. 8, a protective layer 125 is formed, and the protective layer 125 covers at least the redistribution layer 124. In the embodiment, the protective layer 125 covers the second surface 12 of the wafer 1, the grooves 121 and the through holes 122.

Holes 126 are arranged on the protective layer 125, and the redistribution layer 124 is exposed through the holes 126. The holes 126 are arranged on the second surface 12 of the wafer 1.

The protective layer 125 may be made of solder mask ink with photosensitive properties, and the hole 126 is formed on the protective layer 125 by an exposure and development process.

Figure 9:
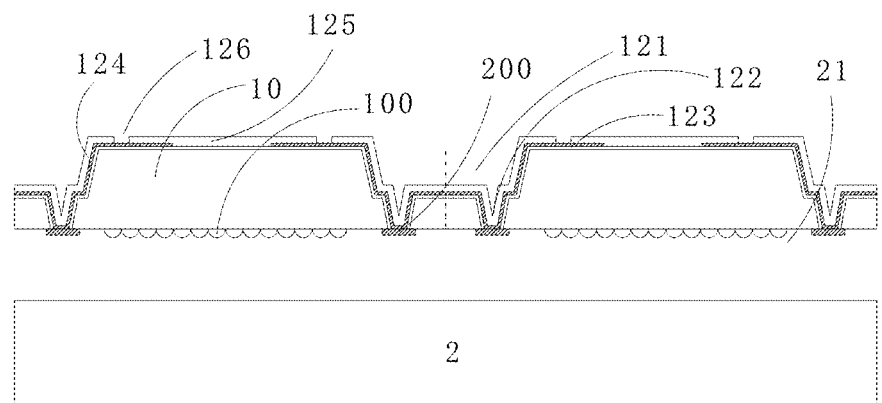
FIG. 9 is a schematic structural diagram obtained after a protective substrate is removed according to an embodiment of the present disclosure.

Referring to FIG. 9, the protective substrate 2 is removed. The temporary bonding adhesive layer 21 is made of the UV glue in the embodiment, the protective tap 22 on the protective substrate 2 is removed, and the temporary bonding adhesive layer 21 is irradiated with the UV light through the protective substrate 2, to make the temporary bonding adhesive layer 21 lose stickiness, and then the protective substrate 2 is removed.

In a case that the temporary bonding adhesive layer 21 is made of a heat sensitive glue, the temporary bonding adhesive layer 21 loses stickiness by a pyrolysis bonding process. In order to prevent a solder bump 127 from being affected by the pyrolysis bonding process, the solder bump 127 is formed after the protective substrate 2 is removed.

After the protective substrate 2 is removed, the remaining temporary bonding adhesive on the front surface of the wafer 1 is removed by a cleaning process.

Figure 10:
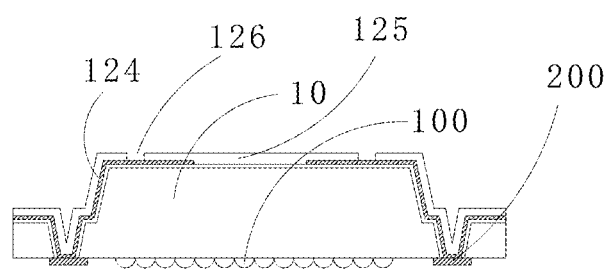
FIG. 10 is a schematic sectional view of a fingerprint sensing chip according to a preferred embodiment of the present disclosure.

Referring to FIG. 10, the wafer 1 is cut by a cutting process to separate the adjacent fingerprint sensing chips 10 from each other.

Figure 11:
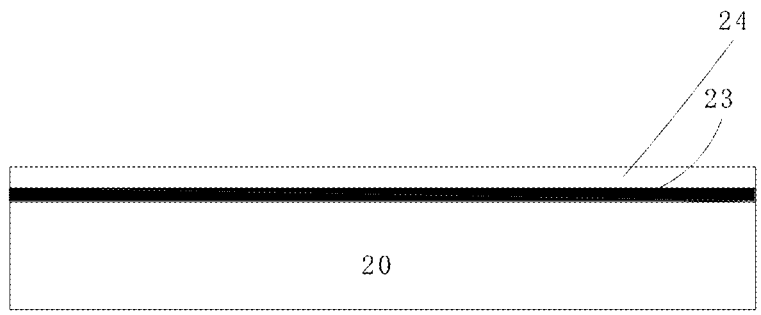
FIG. 11 is a schematic sectional view of a cover plate according to a preferred embodiment of the present disclosure.

Referring to FIG. 11, a cover plate 20 is provided, the cover plate 20 has a front surface 21 and a back surface opposite to each other, and a shading ink layer 23 and a DAF film 24 are formed on the back surface of the cover plate 20 sequentially.

Figure 12:
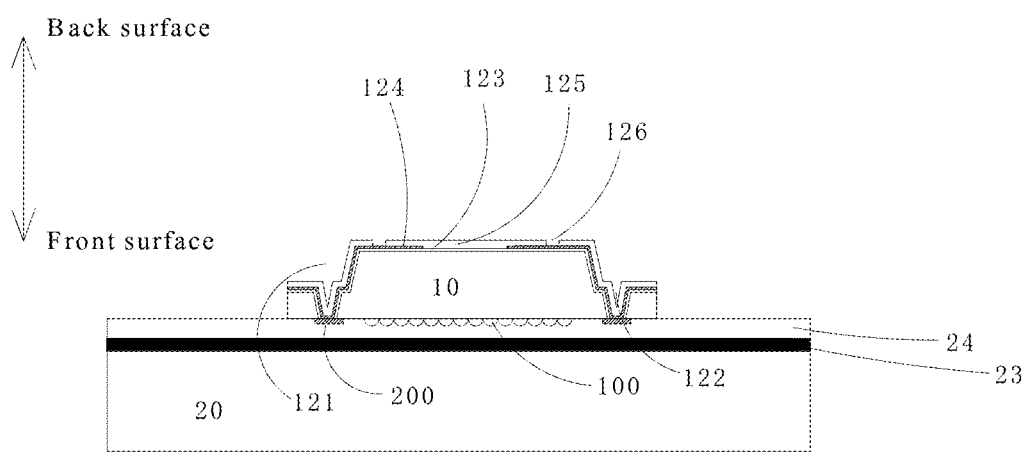
FIG. 12 is a schematic sectional view obtained after a cover plate is laminated with a fingerprint sensing chip according to a preferred embodiment of the present disclosure.

Referring to FIG. 12, the front surface of the fingerprint sensing chip 10 is laminated with the back surface of the cover plate 20.

Figure 13:
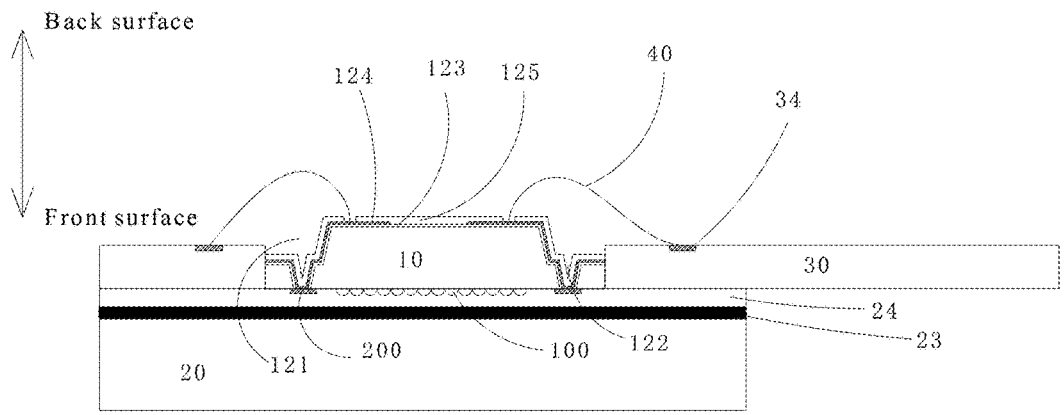
FIG. 13 is a schematic sectional view obtained after a cover plate is laminated with a flexible printed circuit according to a preferred embodiment of the present disclosure.

Referring to FIG. 13, a front surface of a flexible printed circuit 30 is laminated with the back surface of the cover plate 20. The flexible printed circuit 30 has the front surface and a back surface opposite to each other. A second conductive structure is arranged on the back surface of the flexible printed circuit 30. In the embodiment, the second conductive structure 34 is a metal pad 34 exposed from the flexible printed circuit 30. An opening 33 is arranged on the flexible printed circuit 30, and the opening 33 is arranged to avoid the conductive circuit of the flexible printed circuit 30, a shape of the opening 33 is not limited, as long as the fingerprint sensing chip can penetrate the opening 33. Conductive terminals electrically connected to the external device are arranged on the flexible printed circuit, which are not repeated in the present disclosure.

The fingerprint sensing chip 10 is arranged in the opening 33. The redistribution layer 124 exposed at the bottom of the hole 126 on the fingerprint sensing chip 10 is electrically connected to the metal pad 34 on the back surface of the flexible printed circuit 30 through a metal wire 40 by a wire bonding process.

Compared with the conventional technology in which the fingerprint sensing chip 10 is used as a pressure-bearing plate, in the present disclosure, the cover plate 20 is used as a pressure-bearing plate in the wiring bonding process, thereby increasing a pressure-bearing area, avoiding a risk of damaging the fingerprint sensing chip in the conventional technology, and improving the stability and the yield of a process operation.

Figure 14:
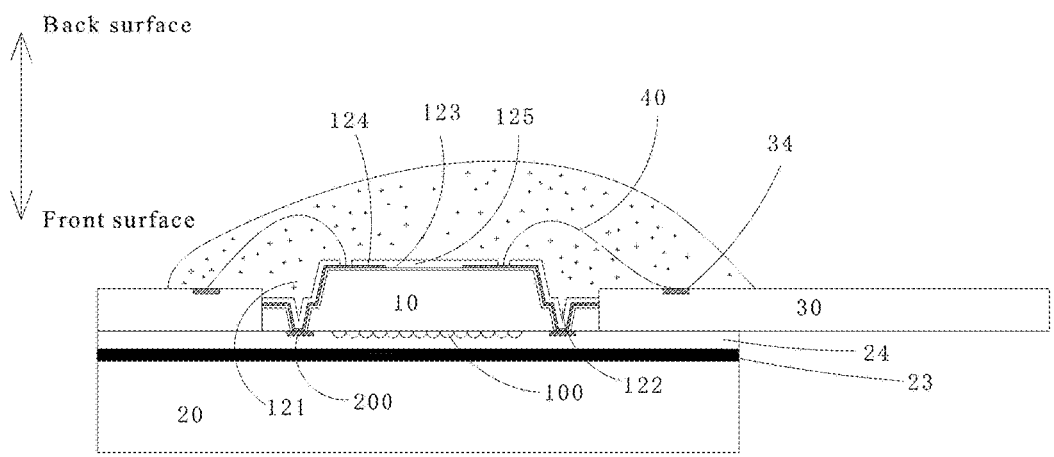
FIG. 14 is a schematic sectional view obtained after a plastic packaging layer is formed according to a preferred embodiment of the present disclosure.

Referring to FIG. 14, a plastic packaging layer 50 is formed, and the plastic packaging layer 50 is arranged to clad at least the metal wire 40. In the embodiment, the plastic packaging layer is arranged to clad the whole opening 33, the fingerprint sensing chip 10, the metal wire 40 and the metal pad 34, thereby improving the stability of the fingerprint sensing chip package.

In another embodiment of the present disclosure, after the step in FIG. 14 is completed, for the front frame 60 and the rear cover 70 clamped and fixed with the front frame 60, reference is made to FIG. 2. The front frame 60 is arranged on a front surface 21 of the cover plate 20, the front frame 60 is provided with a window 61, and a partial region of the fingerprint cover plate 20 is exposed through the window 61, the partial region corresponds to the fingerprint sensing region 100, thereby facilitating fingerprint information acquisition of the fingerprint sensing chip 10. The rear cover 70 is arranged on the back surface of the flexible printed circuit 30, and an accommodating cavity is formed by surrounding by the front frame 60 and the rear cover 70.

In order to further improve the stability of the fingerprint sensing chip package, a plastic packaging material is filled in gaps in the accommodating cavity. The flexible printed circuit 30 is partially exposed outside the accommodating cavity, thereby facilitating electrically connecting the flexible printed circuit 30 to an external circuit.

The beneficial effects of the present disclosure is to decrease the packaging size of the fingerprint sensing chip by optimizing the fingerprint sensing chip packaging method and the fingerprint sensing chip package, thereby meeting a high integration level requirement and a high stability requirement of electronic products and improving the stability of the fingerprint sensing chip package.

It should be understood that while the specification is described in terms of embodiments, not every embodiment includes only one independent technical solution, and the specification is described in this manner merely for clarity. Those skilled in the art should consider the specification as a whole, and the technical solutions in the embodiments may also be suitably combined to form other embodiments understandable for those skilled in the art.

A series of detailed description above merely illustrates the feasible embodiments of the present disclosure, and is not intended to limit the protection scope of the present disclosure. Any equivalent embodiment or variation made without departing from the technical spirit of the present disclosure should fall within the protection scope of the present disclosure.

The invention claimed is:

1. A fingerprint sensing chip packaging method, comprising:
   providing a cover plate;
   providing a fingerprint sensing chip, wherein a fingerprint sensing region and contact pads arranged at periphery of the fingerprint sensing region are arranged on a front surface of the fingerprint sensing chip, electrically connecting the contact pads to a back surface of the fingerprint sensing chip, and forming, on the back surface of the fingerprint sensing chip, a first conductive structure electrically connected to the contact pads;
   laminating the front surface of the fingerprint sensing chip with a back surface of the cover plate;
   providing a flexible printed circuit, wherein a second conductive structure is arranged on a back surface of the flexible printed circuit, and an opening is arranged in the flexible printed circuit;
   laminating a front surface of the flexible printed circuit with the back surface of the cover plate, wherein the fingerprint sensing chip is arranged in the opening; and
   electrically connecting the first conductive structure to the second conductive structure.

2. The fingerprint sensing chip packaging method according to claim 1, wherein the cover plate is a transparent substrate, and a shading ink layer is formed on the back surface of the cover plate before the fingerprint sensing chip is laminated with the cover plate.

3. The fingerprint sensing chip packaging method according to claim 1, wherein a DAF film is adhered to the back surface of the cover plate, to laminate and fix the fingerprint sensing chip with the cover plate.

4. The fingerprint sensing chip packaging method according to claim 1, wherein the back surface of the cover plate is coated with an adhesive, to laminate and fix the fingerprint sensing chip with the cover plate, and a dielectric constant of the adhesive is greater than or equal to 4.

5. The fingerprint sensing chip packaging method according to claim 1, wherein the electrically connecting the contact pads to the back surface of the fingerprint sensing chip and forming the first conductive structure comprises:
   providing a wafer, wherein the wafer comprises a plurality of fingerprint sensing chips arranged in a grid, and the fingerprint sensing region and the contacts pad are arranged on a front surface of the wafer;
   forming grooves at positions on a back surface of the wafer corresponding to the contact pads, wherein the depth of each of the grooves is less than the thickness of the wafer;
   forming through holes in the grooves, wherein the through holes have a one-to-one correspondence with the contact pads, and the contact pads are exposed through the through holes;
   forming an insulation layer which covers the back surface of the wafer, the grooves and the through holes, wherein the contact pads are exposed through the insulation layer;
   forming a redistribution layer, wherein the redistribution layer extends onto the back surface of the wafer and is electrically connected to the contact pads;
   forming a protective layer which covers the redistribution layer; and
   forming a hole on the protective layer, wherein the hole is arranged on the back surface of the wafer, and the redistribution layer is exposed through the hole.

6. The fingerprint sensing chip packaging method according to claim 5, wherein a metal wire is provided, and one end of the metal wire is electrically connected to the redistribution layer exposed through the hole and the other end of the metal wire is electrically connected to the second conductive structure by a wire bonding process.

7. The fingerprint sensing chip packaging method according to claim 4, wherein a plastic packaging layer which clads at least the metal wire is formed after the first conductive structure is electrically connected to the second conductive structure.

8. The fingerprint sensing chip packaging method according to claim 1, wherein after the first conductive structure is electrically connected to the second conductive structure, a front frame is provided on a front surface of the cover plate, the front frame is provided with a window, and a region of the cover plate corresponding to the fingerprint sensing region is exposed through the window, a rear cover is provided on the back surface of the flexible printed circuit, and the rear cover is clamped and fixed with the front frame.

9. The fingerprint sensing chip packaging method according to claim 8, wherein a plastic packaging material is filled in an accommodating cavity formed by surrounding by the front frame and the rear cover through an injection molding process.

10. A fingerprint sensing chip package, comprising:
a cover plate;
a fingerprint sensing chip, wherein a fingerprint sensing region and contact pads arranged at periphery of the fingerprint sensing region are arranged on a front surface of the fingerprint sensing chip, the contact pads are electrically connected to a back surface of the fingerprint sensing chip, a first conductive structure electrically connected to the contact pads is formed on the back surface of the fingerprint sensing chip, and the front surface of the fingerprint sensing chip is laminated with a back surface of the cover plate; and
a flexible printed circuit, wherein a second conductive structure is arranged on a back surface of the flexible printed circuit, an opening is arranged in the flexible printed circuit, a front surface of the flexible printed circuit is laminated with the back surface of the cover plate, the fingerprint sensing chip is arranged in the opening, and the first conductive structure is electrically connected to the second conductive structure.

11. The fingerprint sensing chip package according to claim 10, wherein the cover plate is a transparent substrate, and the back surface of the cover plate is coated with shading ink.

12. The fingerprint sensing chip package according to claim 10, further comprising a DAF film, wherein two surfaces of the DAF film are adhered to the cover plate and the fingerprint sensing chip respectively.

13. The fingerprint sensing chip package according to claim 10, wherein the back surface of the cover plate is coated with an adhesive, to laminate and fix the fingerprint sensing chip with the cover plate, and a dielectric constant of the adhesive is greater than or equal to 4.

14. The fingerprint sensing chip package according to claim 10, wherein the first conductive structure comprises:
grooves formed on the back surface of the fingerprint sensing chip, wherein positions of the grooves correspond to positions of the contact pads, and the depth of each of the grooves is less than the thickness of the fingerprint sensing chip;
through holes formed in the grooves, wherein the through holes have a one-to-one correspondence with the contact pads, and the contact pads are exposed through the though holes;
an insulation layer which covers the back surface of the fingerprint sensing chip, the grooves and the through holes, wherein the contact pads are exposed through the insulation layer;
a redistribution layer arranged on the insulation layer, wherein the redistribution layer extends onto the back surface of the fingerprint sensing chip and is electrically connected to the contact pads;
a protective layer which covers the redistribution layer; and
a hole formed on the protective layer, wherein the hole is arranged on the back surface of the fingerprint sensing chip, and the redistribution layer is exposed through the hole.

15. The fingerprint sensing chip package according to claim 14, further comprising a metal wire, wherein one end of the metal wire is electrically connected to the redistribution layer exposed through the hole, and the other end of the metal wire is electrically connected to the second conductive structure.

16. The fingerprint sensing chip package according to claim 15, further comprising a plastic packaging layer which clads at least the metal wire.

17. The fingerprint sensing chip package according to claim 10, wherein a front frame is provided on a front surface of the cover plate, the front frame is provided with a window, a region of the cover plate corresponding to the fingerprint sensing region is exposed through the window, a rear cover is provided on the back surface of the flexible printed circuit, and the rear cover is clamped and fixed with the front frame.

18. The fingerprint sensing chip package according to claim 17, wherein a plastic packaging material is filled in an accommodating cavity formed by surrounding by the front frame and the rear cover.

* * * * *